(12) United States Patent
Rocktaeschel et al.

(10) Patent No.: US 11,360,293 B2
(45) Date of Patent: Jun. 14, 2022

(54) CATADIOPTRIC PROJECTION LENS AND METHOD FOR PRODUCING SAME

(71) Applicant: Carl Zeiss SMT GmbH, Oberkochen (DE)

(72) Inventors: Martin Rocktaeschel, Abtsgmuend (DE); Michael Grupp, Aalen (DE); Hendrik Wagner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 601 days.

(21) Appl. No.: 16/427,718

(22) Filed: May 31, 2019

(65) Prior Publication Data

US 2019/0302434 A1 Oct. 3, 2019

Related U.S. Application Data

(63) Continuation of application No. PCT/EP2017/081230, filed on Dec. 1, 2017.

(30) Foreign Application Priority Data

Dec. 7, 2016 (DE) .......................... 102016224400.0

(51) Int. Cl.
*G02B 17/08* (2006.01)
*G02B 13/18* (2006.01)
*G03F 7/20* (2006.01)

(52) U.S. Cl.
CPC ......... *G02B 17/0836* (2013.01); *G02B 13/18* (2013.01); *G02B 17/08* (2013.01);
(Continued)

(58) Field of Classification Search
CPC .... G02B 17/0836; G02B 13/18; G02B 17/08; G02B 17/0892; G03F 7/70225; G03F 7/70275
See application file for complete search history.

(56) References Cited

U.S. PATENT DOCUMENTS 7,362,508 B2 4/2008 Omura et al.
7,936,441 B2 5/2011 Omura
(Continued)

FOREIGN PATENT DOCUMENTS

CN 1910494 A 2/2007
CN 101171667 A 4/2008
(Continued)

OTHER PUBLICATIONS

German Office Action, with translation thereof, for corresponding DE Appl No. 102016224400.0, dated Aug. 4, 2017.
(Continued)

*Primary Examiner* — James C. Jones
(74) *Attorney, Agent, or Firm* — Fish & Richardson P.C.

(57) ABSTRACT

A catadioptric projection lens images a pattern of a mask in an effective object field of the projection lens into an effective image field of the projection lens with electromagnetic radiation with an operating wavelength λ<260 nm. The projection lens includes a multiplicity of lens elements and a multiplicity of mirrors including at least one concave mirror. The lens elements and mirrors define a projection beam path that extends from the object plane to the image plane and contains at least one pupil plane. The mirrors include a first mirror having a first mirror surface in the projection beam path between the object and pupil planes in the optical vicinity of a first field plane optically conjugate to the object plane. The mirrors also include a second mirror having a second mirror surface in the projection beam path between the pupil and image planes in the optical vicinity of a second field plane that is optically conjugate to the first field plane. The first mirror surface and/or the second mirror surface is a freeform surface.

20 Claims, 5 Drawing Sheets

(52) U.S. Cl.
    CPC ..... *G02B 17/0892* (2013.01); *G03F 7/70225* (2013.01); *G03F 7/70275* (2013.01)

(56) References Cited

U.S. PATENT DOCUMENTS

| | | |
|---|---|---|
| 2002/0039175 A1 | 4/2002 | Shafer et al. |
| 2005/0190435 A1 | 9/2005 | Shafer et al. |
| 2006/0077366 A1 | 4/2006 | Shafer et al. |
| 2007/0165202 A1 | 7/2007 | Koehler et al. |
| 2008/0170216 A1 | 7/2008 | Mann |
| 2009/0092925 A1 | 4/2009 | Omura |
| 2010/0290021 A1* | 11/2010 | Pazidis ............... G03F 7/70958 427/523 |

FOREIGN PATENT DOCUMENTS

| | | |
|---|---|---|
| CN | 104570610 A | 4/2015 |
| DE | 10 2008 005 006 A1 | 7/2008 |
| EP | 1 480 065 A2 | 11/2004 |
| TW | 528880 B | 4/2003 |
| WO | WO 2004/019128 A1 | 3/2004 |
| WO | WO 2005/026843 A2 | 3/2005 |
| WO | WO 2005/069055 A2 | 7/2005 |
| WO | WO 2006/121008 A1 | 11/2006 |

OTHER PUBLICATIONS

Translation of International Search Report for corresponding PCT Appl No. PCT/EP2017/081230, dated Apr. 4, 2018.
Chinese Office Action, with translation thereof, for corresponding CN Appl No. 201780084347.0, dated Mar. 18, 2021.

* cited by examiner

CATADIOPTRIC PROJECTION LENS AND METHOD FOR PRODUCING SAME

CROSS-REFERENCE TO RELATED APPLICATIONS

The present application is a continuation of, and claims benefit under 35 USC 120 to, international application PCT/EP2017/081230, filed Dec. 1, 2017, which claims benefit under 35 USC 119 of German Application No. 10 2016 224 400.0, filed Dec. 7, 2016. The entire disclosure of these applications are incorporated by reference herein.

FIELD

The disclosure relates to a catadioptric projection lens for imaging a pattern of a mask arranged in an object field of an object plane of the projection lens into an image field arranged in the image plane of the projection lens using electromagnetic radiation of an operating wavelength $\lambda<260$ nm, and to a method for producing such a projection lens.

BACKGROUND

To produce semiconductor components and other finely structured components, such as e.g. photolithography masks, predominantly microlithographic projection exposure methods are used nowadays. Here, use is made of masks (reticles) or other pattern generating devices, which carry or form the pattern of a structure to be imaged, e.g. a line pattern of a layer of a semiconductor component. The pattern is positioned in the region of the object plane of the projection lens between an illumination system and a projection lens in a projection exposure apparatus and it is illuminated by illumination radiation provided by the illumination system. The radiation, which has been changed by the pattern, travels in the form of projection radiation along a projection beam path through the projection lens, which images the pattern onto the substrate to be exposed at a reduced scale. The surface of the substrate is arranged in the image plane of the projection lens, which image plane is optically conjugate to the object plane. The substrate is generally coated with a radiation-sensitive layer (resist, photoresist).

One of the aims in the development of projection exposure apparatuses is to produce lithographically structures having smaller and smaller dimensions on the substrate. In the case of e.g. semiconductor components, smaller structures lead to higher integration densities; this generally has a beneficial effect on the performance of the microstructured components produced.

The size of the structures that can be produced depends on the resolving power of the employed projection lens, and the latter can be increased, firstly, by reducing the wavelength of the projection radiation used for the projection and, secondly, by increasing the image-side numerical aperture NA of the projection lens used in the process. These days, highly resolving catadioptric projection lenses operate at operating wavelengths of less than 260 nm in the deep ultraviolet (DUV) range, in particular at approximately 193 nm.

In order to ensure a sufficient correction of aberrations (e.g. chromatic aberrations, image field curvature) in the case of wavelengths in the deep ultraviolet (DUV) range, use is usually made of catadioptric projection lenses which include both a plurality of transparent refractive optical elements with refractive power (lens elements) and one or more reflective elements with refractive power, i.e. one or more curved mirrors, possibly also one or more plane mirrors. The projection lenses considered here typically include at least one concave mirror.

Integrating a concave mirror into a projection lens for microlithographic projection exposure methods is not easy because it reflects the radiation substantially back in the direction from which it is incident. In order to integrate a concave mirror into an optical imaging system such that neither problems relating to beam vignetting nor those relating to pupil obscuration arise, inter alia catadioptric projection lenses have been developed which use an object field that is arranged entirely outside the optical axis (off-axis systems). The off-axis systems can be divided into folded systems with geometric beam splitting via one or more planar deflection mirrors (folding mirrors) and what are known as "in-line systems," which have straight (non-folded) optical axes common to all optical elements.

A group of catadioptric projection lenses with geometric beam splitting and a concave mirror, arranged in the vicinity of a pupil plane, uses two planar deflection mirrors, arranged in the optical vicinity of a field plane, in order to separate the partial beam path extending from the object field to the concave mirror from the partial beam path extending from the concave mirror to the image field. Some projection lenses having deflection mirrors consist of two imaging lens parts that are connected one behind the other and have a single real intermediate image between the object plane and image plane (see for example US 2006/0077366 A1). In other types, three imaging lens parts that are connected one behind another are present, which means that exactly two real intermediate images are produced (see e.g. WO 2004/019128 A1 (corresponding to U.S. Pat. No. 7,362,508 B2) or EP 1 480 065 A2).

The international patent application with the publication number WO 2005/069055 A2 discloses exemplary embodiments for catadioptric in-line systems having three imaging lens parts that are connected one behind another, and two concave mirrors which are each arranged at an optical distance from a pupil surface.

There are various possibilities for transferring the image of a pattern of a mask onto the substrate. In one variant, the entire pattern is placed in the effective object field of the projection lens and imaged in an exposure onto the substrate, wherein the mask and the substrate do not move during the exposure time interval. Corresponding projection exposure apparatuses are generally referred to as "stepper systems." In alternative systems, different regions of the pattern to be transferred are transferred onto the substrate in temporal succession. To this end, a scanning operation is performed during an exposure time interval in which the mask in the object plane is moved relative to the effective object field of the projection lens, while the substrate is moved synchronously with the movement of the mask in the region of the image plane relative to the effective image field of the projection lens with adapted movement speed in one scanning direction. Projection exposure apparatuses which are set up for such scanning operations are generally referred to as "scanner systems." The effective object field and the effective image field are generally significantly narrower in the scanning direction than in the cross scanning direction that is perpendicular thereto.

Integrated circuits are produced by a sequence of photolithographic structuring steps (exposures) and subsequent processing steps, such as etching and doping, of the substrate. The individual exposures are usually performed using different masks or different patterns. So that the completed circuit exhibits the desired function, it is desirable for the individual photolithographic exposure steps to be matched to one another to the best possible extent such that the manufactured structures, e.g. contacts, lines and the components of diodes, transistors and other electrically functional units, come as close as possible to the ideal of the planned circuit layout.

Manufacturing errors may arise, inter alia, when the structures produced in successive exposure steps do not lie on one another with sufficient accuracy, i.e. if the overlay accuracy is inadequate. The overlay accuracy of structures from different manufacturing steps of a photolithographic process is usually referred to by the term "overlay." This term denotes, for example, the overlay accuracy of two successive lithographic planes. The overlay is an important parameter when manufacturing integrated circuits because alignment errors of any type can cause manufacturing errors, such as short circuits or missing connections, and thus restrict the functionality of the circuit.

High demands are also placed on the overlay accuracy of successive exposures in multiple exposure methods. By way of example, a substrate, for example a semiconductor wafer, is exposed twice in succession in the double patterning method (or double exposure method) and the photoresist is processed further thereafter. By way of example, a normal structure with a suitable structure width is projected in a first exposure process. A second mask with a different mask structure is used for a second exposure process. By way of example, periodic structures of the second mask can be displaced by half a period in relation to periodic structures of the first mask. In the general case, the differences between the layouts of the two masks can be large, particularly in the case of more complex structures. Double patterning can achieve a reduction in the period of periodic structures on the substrate. This can only succeed if the overlay accuracy of the successive exposures is sufficiently good; i.e., if the overlay errors do not exceed a critical value.

An insufficient overlay can therefore significantly reduce the yield of good parts during the manufacturing, as a result of which the manufacturing costs per good part increase.

In optical imaging systems having a multiplicity of optical elements, the total aberration errors (total aberrations) are the result of an interaction of the errors of the individual optical elements contributing to the imaging. Since error tolerances for individual components cannot be reduced to any desired extent, generally fine adjustment of the total system is used to minimize the total errors of the system. Such an adjustment process can be highly complex in high-performance microlithographic projection lenses because such projection lenses do not uncommonly include more than ten or more than twenty optical elements. Without precise adjustment, the desired imaging performances with resolutions in the sub-micrometer range generally cannot be achieved in these complex systems.

A fine adjustment process typically includes a plurality of different manipulations on lens elements or other optical elements. These include lateral displacements of the elements perpendicularly to the optical axis, displacements of elements along the optical axis to change air gaps, and/or rotation of elements about the optical axis. Tilting of individual elements can also be provided. The adjustment procedure is performed under the control of a suitable aberration measurement of the imaging system so as to check the effects of the manipulations and to be able to derive instructions for further adjustment steps.

The extent to which the desired properties relating to the imaging performance of the projection lenses keep increasing is also the extent to which the aberration specifications for projection lenses keep being tightened. The result of this is that the desired properties relating to the adjustment processes have also become increasingly demanding so as to realize the specifications under economic conditions.

SUMMARY

The disclosure seeks to provide a catadioptric projection lens of the type mentioned in the introductory part which offers improved imaging performance over conventional catadioptric projection lenses of this type while keeping the manufacturing outlay acceptable. In particular, the intention is to provide new possibilities of aberration minimization for critical customer applications that are able to offer to the end user significant improvements in particular when producing critical layers in semiconductor manufacturing.

In an aspect, the disclosure provides a catadioptric projection lens for imaging a pattern of a mask arranged in an effective object field of an object plane of the projection lens into an effective image field arranged in the image plane of the projection lens by means of electromagnetic radiation with an operating wavelength $\lambda<260$ nm. The catadioptric projection lens includes a multiplicity of lens elements and a multiplicity of mirrors including at least one concave mirror. The lens elements and mirrors define a projection beam path that extends from the object plane to the image plane and contains at least one pupil plane. The mirrors include a first mirror having a first mirror surface which is arranged in the projection beam path between the object plane and the pupil plane in the optical vicinity of a first field plane that is optically conjugate to the object plane. The mirrors also include a second mirror having a second mirror surface which is arranged in the projection beam path between the pupil plane and the image plane in the optical vicinity of a second field plane that is optically conjugate to the first field plane. The first mirror surface and/or the second mirror surface is configured as a freeform surface.

In an aspect, the disclosure provides a method for producing a catadioptric projection lens for imaging a pattern of a mask arranged in an effective object field of an object plane of the projection lens into an effective image field arranged in the image plane of the projection lens by means of electromagnetic radiation with an operating wavelength $\lambda<260$ nm. The method includes constructing an initial projection lens having a multiplicity of lens elements and a multiplicity of mirrors including at least one concave mirror such that the lens elements and mirrors define a projection beam path that extends from the object plane to the image plane and contains at least one pupil plane. The mirrors include a first mirror having a first mirror surface which is arranged in the projection beam path between the object plane and the pupil plane in the optical vicinity of a first field plane that is optically conjugate to the object plane. The mirrors also include a second mirror having a second mirror surface which is arranged in the projection beam path between the pupil plane and the image plane in the optical vicinity of a second field plane that is optically conjugate to the first field plane. The method also includes measuring an imaging quality of the projection lens to determine a spatial distribution of the extent of at least one target aberration in the effective image field, and selecting the first mirror surface and/or the second mirror surface as the correction surface. The method further includes changing the first mirror surface and/or the second mirror surface such that the first mirror surface and/or the second mirror surface is configured as a freeform surface in a manner such that a level of the target aberration in the effective image field is reduced as compared to the level in the initial projection lens.

The catadioptric projection lenses under consideration here include a multiplicity of lens elements and a multiplicity of mirrors, among which is at least one concave mirror. The lens elements and mirrors define a projection beam path, which extends from the object plane to the image plane and contains at least one pupil plane. The mirrors include a first mirror having a first mirror surface, which is arranged in the projection beam path between the object plane and the pupil plane in the optical vicinity of a first field plane that is optically conjugate to the object plane. The mirrors furthermore include a second mirror having a second mirror surface, which is arranged in the projection beam path between the pupil plane and the image plane in the optical vicinity of a second field plane that is optically conjugate to the first field plane. The two mirrors (first mirror and second mirror) are thus, inter alia, characterized in that (i) both mirrors are arranged in the relative near field (in the optical vicinity of a field plane or at an optical distance from a pupil plane), and in that (ii) a pupil plane is located along the projection beam path between the mirrors.

The inventors have recognized that these special conditions can be used to systematically create during the adjustment process projection lenses that are characterized by a very low residual aberration level, while keeping the outlay acceptable. It has in particular been recognized that, under these conditions, higher orders of the field profiles of aberrations can be influenced which cannot be addressed or corrected with other adjustment measures, or can be addressed or corrected only with very great outlay. This is accomplished by virtue of the first mirror surface and/or the second mirror surface having the form of a freeform surface.

The term "freeform surface" within the meaning of this application refers to a non-rotation-symmetric surface that deviates from a best-adapted rotation-symmetrically curved reference surface or a planar reference surface at one or more locations by an absolute deviation value that lies outside the manufacturing tolerances. A freeform surface consequently exhibits a significant and deliberate deviation from a rotation-symmetric shape. A planar shape is here also considered to be a rotation-symmetric shape. The surface shape of the first mirror surface and/or the second mirror surface can be deliberately configured such that specific aberrations that may occur due to the optical design and/or due to manufacturing errors can be partially or completely compensated. Those aberrations that need to be influenced primarily are also referred to in this application as target aberrations.

The first mirror surface and/or the second mirror surface can thus be provided with a non-rotation-symmetric asphere or a non-planar surface in the form of a freeform surface. Since this type of surface primarily serves to correct one aberration or a plurality of aberrations, it can also be referred to as a "correction asphere." A "correction asphere" is to be distinguished from what is known as a "design asphere." Although the shape of a design asphere is fixed as part of the original optical design and frequently exhibits rotation symmetry, the shape of a correction asphere typically comes about for each individual projection lens individually, for example due to measurements during the adjustment. The absolute deviation value by which a freeform surface deviates from the best-adapted rotation-symmetrically curved or planar reference surface is typically in the range of a few nanometers (nm), for example in the range from approximately 5 nm to approximately 100 nm, possibly even more or less.

Due to the arrangement of the first mirror surface and the second mirror surface in the optical vicinity of a nearest field plane, it is possible with the aid of a freeform surface on one of the mirrors or on both mirrors to influence particularly well aberrations having an extent within the image field which can differ from field point to field point.

In particular, it may be the case that the imaging quality of the (not yet corrected) starting projection lens is characterizable by a higher order of the field variation (or a multiwave variation) of the magnitude of at least one target aberration in a field direction of the image field, wherein the freeform surface of the best-adapted planar or rotation-symmetric reference surface deviates at one or more positions and a spatial distribution of the deviations is set such that the variation is reduced as compared to a reference configuration in which the mirror surface has the shape of the best-adapted reference surface. The term "multiwave variation" here denotes that the extent of the aberration in the field direction observed has a plurality of local minima and a plurality of local maxima. The greater the number of the local extremes, the higher the field variation over the image field.

The variation of the magnitude of the target aberration can be quantified for example by what is known as the peak-to-valley ratio (PV value), which is defined as the difference between the highest and the lowest value of the target aberration along the field direction of the image field. The at least one freeform surface at a near-field mirror surface can thus be configured such that a reduction of higher orders of field profiles of aberrations is achieved. In particular, such higher orders of field profiles cannot be addressed, or can be addressed only poorly, with correction measures, in particular correction aspheres, at other positions in the projection beam path, in particular when these do not have optical surfaces in near-field positions.

The order of the target aberration corrections is here dependent on the spatial frequency of the hills and valleys chasing one another in one direction on the freeform surface. With the aid of symmetry considerations, a distinction can be made between even aberrations and odd aberrations. A criterion that can be used is the azimuthal number of a pupil Zernike, that is to say the number of a symmetry with respect to the center of the pupil in the case of a rotation in the circumferential direction. If the azimuthal number of a pupil Zernike is even (e.g. two or four), this will be referred to in the context of the present application as an even aberration. If the azimuthal number of the pupil Zernike is odd (e.g. three), this is referred to as an odd aberration.

In particular, for an overlay correction, the odd pupil Zernikes can be addressed. The overlay can be described as a linear combination of odd-numbered pupil Zernikes dependent on the illumination setting. The odd target aberrations which are correctable particularly well with the aid of mirror surfaces, in the form of freeform surfaces, of near-field mirrors include wavefront tilt (describable by Zernike coefficients Z2/Z3), coma (Z7/Z8), trefoil (Z10/Z11), higher-order coma (Z14/Z15) etc.

Due to the fact that a pupil plane is located between the first mirror surface and the second mirror surface, it is under certain circumstances possible to influence one class of aberrations or disturbances in a targeted manner in a desired direction, without at the same time causing undesired aberrations or disturbances on another class. In particular, even aberrations, for example defocus, and odd aberrations, for example distortion, can be addressed independently from one another. For example, it is possible for the correction to be effected such that, on the mirror that is located before the pupil plane, even-numbered disturbances (e.g. defocus) and odd-numbered disturbances (e.g. distortion) with the same sign are corrected. On the other mirror, behind the pupil plane, either even-numbered disturbances (e.g. defocus) or odd-numbered disturbances (e.g. distortion) can be addressed, because the sign of one of the two variables changes. In this way, any type of disturbance can be corrected, while the other remains largely unaffected thereby. For example, the distortion that is relevant for the overlay can be improved, without making the even aberrations worse. Conversely, the even aberrations can be improved, without making the distortion worse. In principle, for example any desired linear combination of distortion aberration and even aberrations can be set by changing the amplitudes of the maxima and minima of the freeform surfaces. If desired, it is possible with corresponding design of the freeform surface(s) with relatively low deformations of the freeform surfaces to attain a relatively strong change in the reduction of the addressed aberration level.

It is possible that a correction of one or more addressed target aberrations can be achieved when only one of the mirror surfaces (first mirror surface or second mirror surface) is in the form of a freeform surface, while the other mirror surface (second mirror surface or first mirror surface) has a rotation-symmetric or planar shape. However, by using only one mirror as correction asphere, the correction potential cannot be fully utilized.

If, on the other hand, in accordance with a development the first mirror surface is formed as a first freeform surface and the second mirror surface is formed as a second freeform surface, further degrees of freedom in the targeted correction of aberrations are obtained. Undesired collateral aberrations induced by the correction using only one mirror can be effectively corrected by the other mirror. By using two mirrors with freeform surfaces (of generally different shapes), the correction potential thus increases.

The first freeform surface and the second freeform surface preferably have significantly differing shapes.

In particular, the shape of the first freeform surface can be adapted to the shape of the second freeform surface such that the first freeform surface brings about a desired change of at least one target aberration and an undesired change of at least one residual aberration, and the second freeform surface is shaped such that the change of the residual aberration caused by the first freeform surface is at least partially compensated. In this way, the undesired generation of parasitic residual aberrations can be partially or completely suppressed, which means that substantially the desired effect on the target aberration addressed remains. At the same time, the target aberration is preferably influenced in the desired direction, such that an increase of the effect on the target aberration occurs.

It is possible that an optical element is located between the first mirror surface and the first field plane closest to it and/or between the second mirror surface and the second field plane closest to it. A correction effect which is settable particularly well can be attained, however, if no optical element is arranged between the first mirror surface and the first field plane and/or if no optical element is arranged between the second mirror surface and the second field plane. This arrangement, without an optical element being interposed, is also referred to as "immediate vicinity."

In preferred embodiments, the first mirror surface and/or the second mirror surface are arranged in the projection beam path such that a subaperture ratio SAR on the first mirror surface and/or on the second mirror surface is, in terms of absolute value, smaller than 0.3, in particular smaller than 0.2. In this way it is possible to ensure that different field points can be influenced largely independently of one another by the shape of the freeform surfaces.

The advantages of the claimed disclosure and the variants thereof can be utilized in different types of projection lenses. In particular, the catadioptric projection lens can employ an object field that is arranged entirely outside the optical axis, that is to say can be configured as an off-axis system.

In some embodiments, the projection lens has a first lens part for imaging the effective object field into a first real intermediate image, a second lens part for producing a second real intermediate image using the radiation coming from the first lens part, and a third lens part for imaging the second real intermediate image into the image plane, wherein the first real intermediate image is located in the optical vicinity of the first mirror surface, and the second real intermediate image is located in the optical vicinity of the second mirror surface. Such three-piece catadioptric systems with exactly two intermediate images have proven to be particularly suitable for attaining extremely high resolutions in a large effective image field suitable for lithography.

The case may be that the first mirror and the second mirror are designed as plane mirrors and a concave mirror is arranged in the optical vicinity of the pupil plane that is located between the first field plane and the second field plane. In this case, the best-adapted reference surface of the first mirror and of the second mirror is in each case one plane. The plane mirrors are used as deflection mirrors for separating the partial beam path extending from the object field to the concave mirror from the partial beam path extending from the concave mirror to the image field. Examples of such folded projection lenses having exactly two real intermediate images can be found for example in WO 2004/019128 A1 (corresponding to U.S. Pat. No. 7,362, 508 B2) or EP 1 480 065 A2 or WO 2006/121008 A1.

Exemplary embodiments in which the first mirror and the second mirror are each configured as concave mirrors also exist. The international patent application with the publication number WO 2005/069055 A2 discloses for example exemplary embodiments for catadioptric in-line systems having three imaging lens parts that are connected one behind another, and two relatively near-field concave mirrors which are arranged in each case at an optical distance from a pupil plane and can serve as first and second mirror. It is also possible that the first mirror surface and/or the second mirror surface is convexly curved.

Some projection lenses having two plane deflection mirrors also consist of only two imaging lens parts that are connected one behind the other and have only a single real intermediate image between the object plane and image plane (see for example US 2006/0077366 A1). The deflection mirrors (one or both) can here also be provided with correction aspheres in the form of freeform surfaces. One of the mirrors can then be arranged in the optical vicinity of the object plane, while the other mirror is arranged in the optical vicinity of the intermediate image.

In a method for producing a catadioptric projection lens, first an initial projection lens having an optical construction in accordance with the optical design is constructed and adjusted in a conventional manner. As part of it, and/or afterward, a measurement of the imaging quality of the projection lens is performed to determine a spatial distribution of the extent of at least one target aberration in the effective image field. Subsequently, the first mirror surface and/or the second mirror surface is selected as the correction surface, and the first mirror surface and/or the second mirror surface is changed such that the first mirror surface and/or the second mirror surface has the form of a (non-rotation-symmetric) freeform surface in a manner such that a level of the target aberration in the effective image field is reduced as compared to the level in the initial projection lens.

To determine the imaging quality, the wavefront in the effective image field or in a plane that is optically conjugate thereto of the imaging system can be measured for the spatially resolving determination of wavefront aberrations. Based thereon, the change of the topography of the at least one mirror surface that is to be formed as a freeform surface can be calculated. To attain the desired change of the shape of the first mirror surface and/or of the second mirror surface, the first mirror and/or the second mirror is preferably removed from the projection lens, such that it can be processed outside of it. Next, spatially resolving processing of the mirror surface to produce the calculated topography of the freeform surface is performed on the mirror that has been removed. Before the spatially resolving processing, the reflective coating of the mirror substrate is preferably removed and the substrate surface, which is intended for carrying the reflective coating, is then processed by material removal in a spatially resolving fashion using a material-removing method, for example via ion beam processing. Subsequently, a reflective coating is applied again onto the substrate surface, the shape of which is now changed, in a coating step. Finally, the at least one mirror which has been provided with a freeform surface is mounted in a position-accurate fashion at its original position in the projection lens.

By way of the effective correction of, inter alia, the higher-order field profiles of aberrations, new possibilities of aberration minimization are obtained for critical customer applications which can offer the end user significant improvements in particular in the production of critical layers in semiconductor manufacturing.

The special shape of the mirror surfaces of the first mirror and/or of the second mirror can be performed during the initial production of the projection lens before first shipment to a customer. It is also possible to perform a corresponding correction after a certain time of use of the projection lens. This can be expedient for example if the aberration level of critical aberrations increases after prolonged use and/or if the specifications for critical aberrations are tightened with the introduction of new processes.

BRIEF DESCRIPTION OF THE DRAWINGS

Further advantages and aspects of the disclosure are evident from the claims and from the following description of preferred exemplary embodiments of the disclosure, which are explained below with reference to the figures, in which:

DETAILED DESCRIPTION OF EXEMPLARY EMBODIMENTS

Figure 1:
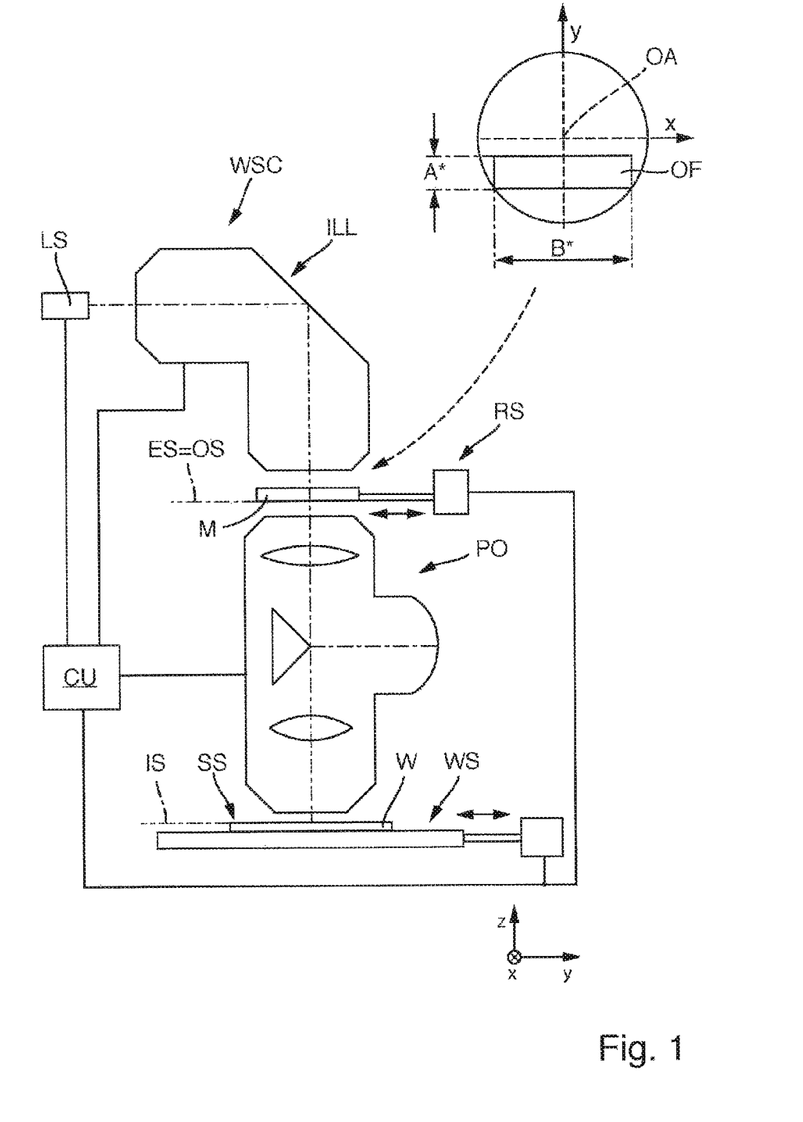
FIG. 1 shows an exemplary embodiment of a microlithographic projection exposure apparatus.

FIG. 1 shows an example of a microlithographic projection exposure apparatus WSC, which is employable in the production of semiconductor components and other finely structured components and which operates with light or electromagnetic radiation from the deep ultraviolet (DUV) range in order to obtain resolutions down to fractions of micrometers. An ArF excimer laser with an operating wavelength $\lambda$ of approximately 193 nm serves as primary radiation source or light source LS. Other UV laser light sources, for example $F_2$ lasers with an operating wavelength of 157 nm or ArF excimer lasers with an operating wavelength of 248 nm, are also possible.

At its exit surface ES, an illumination system ILL disposed downstream of the light source LS generates a large, sharply delimited and substantially homogeneously illuminated illumination field, which is adapted to the desired telecentricity of the projection lens PO arranged downstream thereof in the light path. The illumination system ILL has devices for setting different illumination modes (illumination settings) and it can be switched for example between conventional on-axis illumination with different degrees of coherence σ and off-axis illumination. By way of example, the off-axis illumination modes include annular illumination or dipole illumination or quadrupole illumination or any other multi-polar illumination. The design of suitable illumination systems is known per se and therefore not explained in any more detail here. The patent application US 2007/0165202 A1 (corresponding to WO 2005/026843 A2) shows examples of illumination systems which can be used within the scope of various embodiments.

Those optical components which receive the light from the laser LS and form illumination radiation from the light, which illumination radiation is directed to the reticle M, are part of the illumination system ILL of the projection exposure apparatus.

Arranged downstream of the illumination system is a device RS for holding and manipulating the mask M (reticle) in such a way that the pattern arranged at the reticle lies in the object plane OS of the projection lens PO, which coincides with the exit plane ES of the illumination system and which is also referred to here as reticle plane OS. For the purposes of a scanning operation, the mask is movable in this plane in a scanning direction (y-direction) perpendicular to the optical axis OA (z-direction) with the aid of a scanner drive.

Following downstream of the reticle plane OS is the projection lens PO, which acts as a reduction lens and images an image of the pattern arranged at the mask M with a reduced scale, for example with the scale of 1:4 ($|\beta|=0.25$) or 1:5 ($|\beta|=0.20$), onto a substrate W coated with a photoresist layer, the light-sensitive substrate surface SS of which lies in the region of the image plane IS of the projection lens PO.

The substrate to be exposed, which is a semiconductor wafer W in the exemplary case, is held by a device WS which includes a scanner drive in order to move the wafer synchronously with the reticle M perpendicular to the optical axis OA in a scanning direction (y-direction). The device WS, which is also referred to as "wafer stage," and the device RS, which is also referred to as "reticle stage," are constituents of a scanner device which is controlled by way of a scan control device which, in the embodiment, is integrated in the central control device CU of the projection exposure apparatus.

The illumination field produced by the illumination system ILL defines the effective object field OF used during the projection exposure. In the exemplary case, the latter is rectangular, it has a height A* measured parallel to the scanning direction (y-direction) and it has a width B*>A* measured perpendicular thereto (in the x-direction). In general, the aspect ratio AR=B*/A* lies between 2 and 10, in particular between 3 and 8. The effective object field lies at a distance next to the optical axis in the y-direction (off-axis field). The effective image field IF in the image surface IS, which is optically conjugate to the effective object field, has the same form and the same aspect ratio between the height B and width A as the effective object field, but the absolute field dimension is reduced by the imaging scale β of the projection lens, i.e. A=|β|A* and B=|β|B*.

If the projection lens is designed and operated as an immersion lens, then radiation is transmitted through a thin layer of an immersion liquid during the operation of the projection lens, which thin layer is situated between the exit surface of the projection lens and the image plane IS. Image-side numerical apertures NA>1 are possible during the immersion operation. A configuration as a dry lens is also possible; in this case, the image-side numerical aperture is restricted to values NA<1.

Figure 2:
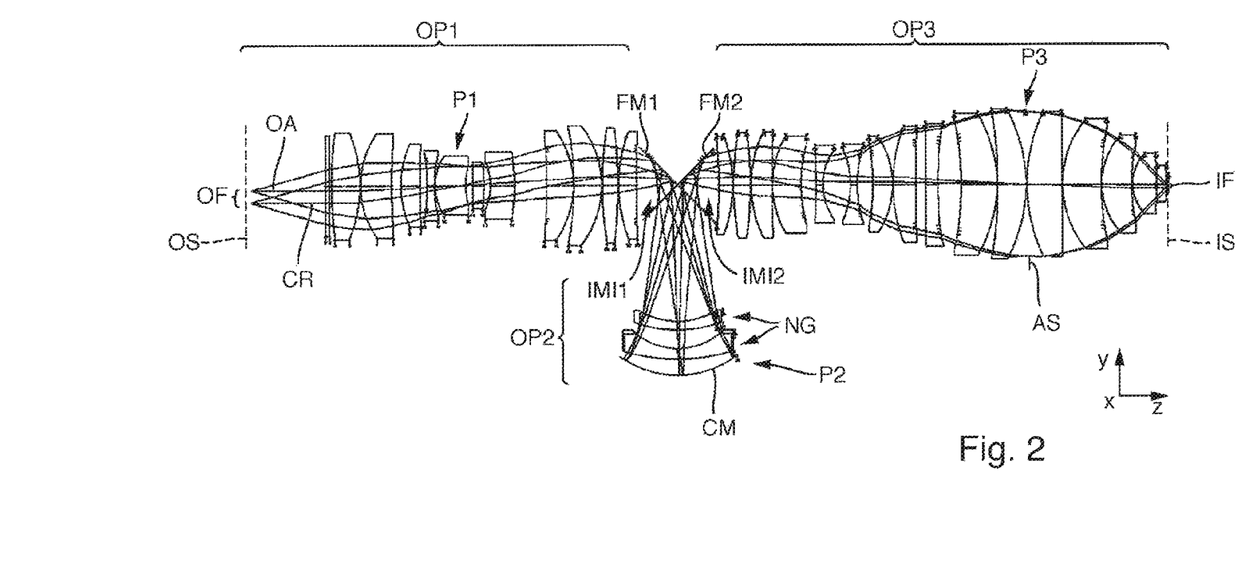
FIG. 2 shows a schematic lens element sectional view of an embodiment of a catadioptric projection lens.
Figure 3A:
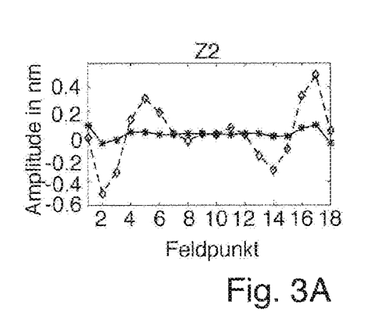
FIGS. 3A-3F show aberration diagrams representing the correction state of the wavefront in the effective image field of the projection lens before and after mirror aspherization on the basis of Zernike fingerprints.
Figure 3B:
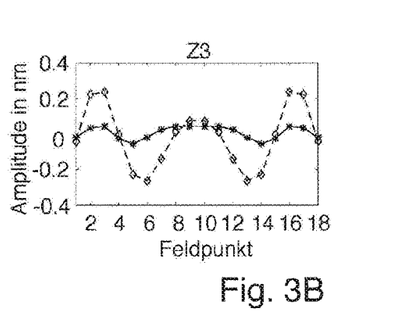
Figure 3C:
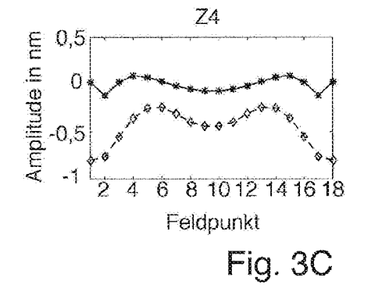
Figure 3D:
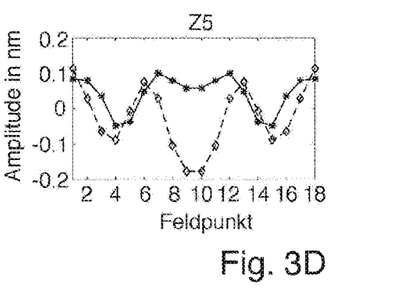
Figure 3E:
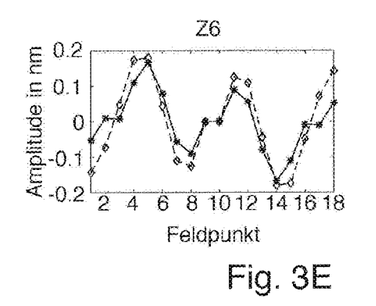
Figure 3F:
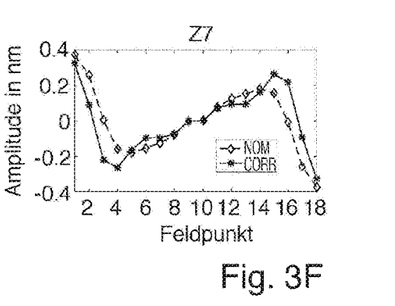
Figure 4A:
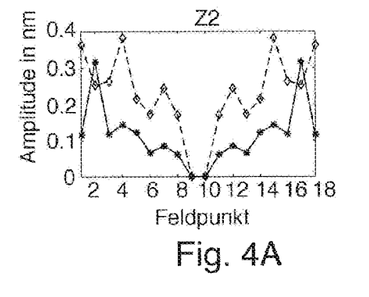
FIGS. 4A-4F show aberration diagrams representing the correction state of the wavefront in the effective image field of the projection lens before and after mirror aspherization on the basis of fading fingerprints.
Figure 4B:
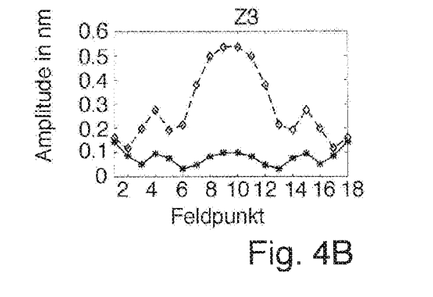
Figure 4C:
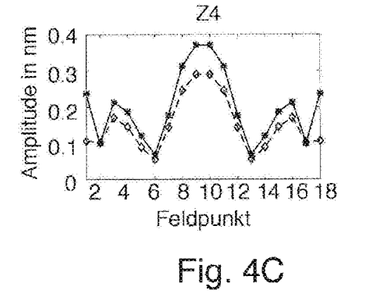
Figure 4D:
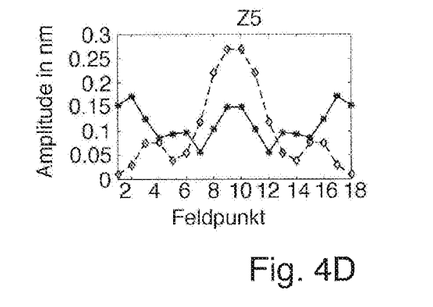
Figure 4E:
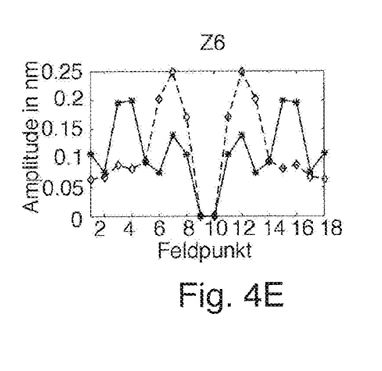
Figure 4F:
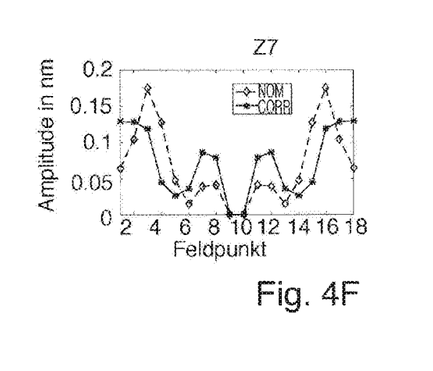

FIG. 2 shows a schematic meridional lens element sectional view of an embodiment of a catadioptric projection lens PO with selected beams for elucidating the imaging beam path of the projection radiation passing through the projection lens during operation. The projection lens is provided as an imaging system with a reducing effect, for imaging, with a reduced scale, for example with the scale of 4:1, a pattern of a mask arranged in its object plane OS onto its image plane IS aligned parallel to the object plane. Here, exactly two real intermediate images IMI1, IMI2 are produced between the object plane and image plane. A first lens part OP1, which is constructed exclusively with transparent optical elements and is therefore refractive (dioptric), is designed in such a way that the pattern of the object plane is imaged into the first intermediate image IMI1 substantially without any change in size. A second, catadioptric lens part OP2 images the first intermediate image IMI1 onto the second intermediate image IMI2 substantially without any change in size. A third, refractive lens part OP3 is designed to image the second intermediate image IMI2 with great reduction into the image plane IS.

Pupil surfaces or pupil planes P1, P2, P3 of the imaging system lie between the object plane and the first intermediate image, between the first and the second intermediate image, and between the second intermediate image and the image plane, respectively, where the chief ray CR of the optical imaging intersects the optical axis OA. The aperture stop AS of the system can be attached in the region of the pupil surface P3 of the third lens part OP3. The pupil surface P2 within the catadioptric second lens part OP2 lies in immediate proximity to a concave mirror CM.

The exemplary embodiment shown in FIG. 2 with respect to its optical construction (without freeform surfaces on the deflection mirrors) corresponds to the exemplary embodiment from FIG. 6 of WO 2006/121008 A1. The disclosure content of this document with respect to the basic construction of the projection lens (including the optical specification) is incorporated by reference in the content of this description.

The catadioptric second lens part OP2 contains the sole concave mirror CM of the projection lens. A negative group NG having two negative lens elements is situated directly upstream of the concave mirror. In this arrangement, which is occasionally referred to as a Schupmann achromate, the Petzval correction, i.e. the correction of the image field curvature, is achieved as a result of the curvature of the concave mirror and the negative lens elements in the vicinity thereof, the chromatic correction as a result of the refractive power of the negative lens elements upstream of the concave mirror and also the stop position with respect to the concave mirror.

A reflective deflection device serves to separate the beam passing from the object plane OS to the concave mirror CM or the corresponding partial beam path from that beam or partial beam path which, after reflection at the concave mirror, passes between the latter and the image plane IS. For this purpose, the deflection device has a plane first deflection mirror FM1 having a first mirror surface MS1 for reflecting the radiation coming from the object plane to the concave mirror CM and a plane second deflection mirror FM2 aligned at right angles to the first deflection mirror FM1 and having a second mirror surface MS2, wherein the second deflection mirror deflects the radiation reflected from the concave mirror in the direction of the image plane IS. Since the optical axis is folded at the deflection mirrors, in this application the deflection mirrors are also referred to as folding mirrors. The deflection mirrors are tilted relative to the optical axis OA of the projection lens about tilt axes extending perpendicularly to the optical axis and parallel to a first direction (x-direction), e.g. by 45°. When configuring the projection lens for the scanning operation, the first direction (x-direction) is perpendicular to the scanning direction (y-direction) and thus perpendicular to the movement direction of the mask (reticle) and substrate (wafer). For this purpose, the deflection device is realized by a prism whose externally reflectively coated cathetus surfaces aligned perpendicularly to one another serve as deflection mirrors.

The intermediate images IMI1, IMI2 each lie in optical proximity to the folding mirrors FM1 and FM2, respectively, closest to them, but can be at a minimum optical distance from them, such that possible defects on the mirror surfaces are not sharply imaged into the image plane, and the plane deflection mirrors (plane mirrors) FM1, FM2 lie in the region of moderate radiation energy density.

The positions of the (paraxial) intermediate images define field planes of the system which are optically conjugate to the object plane and to the image plane, respectively. The deflection mirrors thus lie in optical proximity to field planes of the system, which is also referred to as "near-field" in the context of this application. In this case, the first deflection mirror is arranged in optical proximity to a first field plane, belonging to the first intermediate image IMI1, and the second deflection mirror is arranged in optical proximity to a second field plane, optically conjugate to the first field plane and belonging to the second intermediate image IMI2.

The optical proximity or the optical distance of an optical surface with respect to a reference plane (e.g. a field plane or a pupil plane) is described by the so-called subaperture ratio SAR in this application. For the purposes of this application, the subaperture ratio SAR of an optical surface is defined as follows:

$$SAR = \text{sign } h(|r|/(|h|+|r|))$$

where r denotes the marginal ray height, h denotes the chief ray height and the signum function sign x denotes the sign of x, with sign 0=1 according to convention. The chief ray height is understood to mean the ray height of the chief ray of a field point of the object field with a maximum field height in terms of magnitude. The ray height should be understood to be signed. The marginal ray height is understood to mean the ray height of a ray with a maximum aperture proceeding from the point of intersection between the optical axis and the object plane. This field point need not contribute to transferring the pattern arranged in the object plane—in particular in the case of off-axis image fields.

The subaperture ratio is a signed variable which is a measure of the field or pupil proximity to a plane in the beam path. By definition, the subaperture ratio is normalized to values between −1 and +1, wherein the subaperture ratio is zero in each field plane and wherein the subaperture ratio jumps from −1 to +1, or vice versa, in a pupil plane. Therefore, a subaperture ratio with an absolute value of 1 determines a pupil plane.

An optical surface or a plane is then designated as "(optically) near" an optical reference surface if the subaperture ratios of these two surfaces are comparable in terms of numerical value.

In particular, an optical surface or a plane is designated "(optically) near-field" if it has a subaperture ratio that is close to 0. An optical surface or a plane is designated as "(optically) near-pupil" if it has a subaperture ratio that is close to 1 in terms of absolute value.

For both deflection mirrors it holds true that no optical element is arranged between the deflection mirror and the closest intermediate image (immediate proximity) and that the subaperture ratio SAR, in terms of absolute value, is less than 0.3, in particular less than 0.2.

The deflection mirrors are therefore referred to as being (optically) near-field.

Figure 5A:
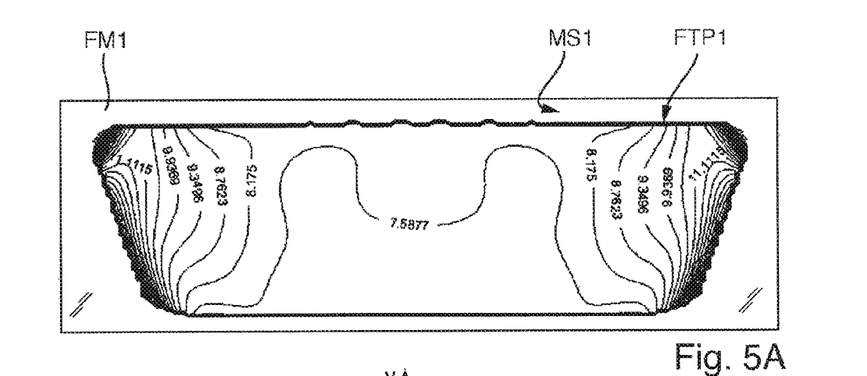
FIGS. 5A and 5B represent the correction of the surface topography of the first deflection mirror (FIG. 5A) and of the second deflection mirror (FIG. 5B) in the illuminated region (footprint) after production of the freeform surface on the basis of lines of the same deformation.
Figure 5B:
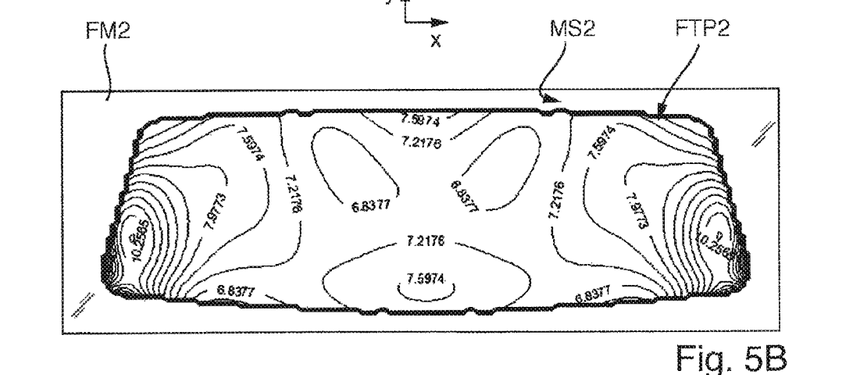

Under these conditions, both deflection mirrors are in each case used in an approximately rectangular or trapezoidal region having rounded corners (cf. FIG. 5). The region illuminated by the rays of the projection beam path coming from the effective object field OF is here also referred to as "footprint." FIG. 5A shows the first footprint FTP1 on the first deflection mirror FM1, FIG. 5B shows the second footprint FTP2 on the second deflection mirror FM2.

Here, the footprint of the projection radiation on an optical surface represents the size and shape of the intersection between the projection beam and the surface illuminated by the projection beam. The optical vicinity to a closest field plane is identifiable by virtue of the footprint substantially having the rectangular form of the effective object field OF, with the edge regions being slightly rounded. The footprint lies outside of the optical axis OA, just like the object field. While the optical region used by the projection radiation substantially has the form of the illuminated field region in the optical vicinity of the field, a substantially circular region is illuminated in the region of a pupil plane Fourier transformed to a field plane such that a footprint in the region of a pupil has at least approximately a circular form.

The great potential of the method proposed in this application for effective correction of aberrations in such projection lenses will now be explained with reference to FIGS. 3 to 5 using a number of examples.

In the field of geometric optics, Zernike polynomials are usually used to represent wavefronts, which in turn describe the imaging aberrations of optical systems. In this case, the individual imaging aberrations can be described by the coefficients of the Zernike polynomials, that is to say the Zernike coefficients or the values thereof (in [nm]). In the representation chosen here, the Zernike coefficients Z2 and Z3 represent the tilt of a wavefront in the x-direction and y-direction, respectively, as a result of which a distortion-like aberration arises. The Zernike coefficient Z4 describes a curvature of the wavefront, whereby a defocus aberration is describable. The Zernike coefficient Z5 describes a saddle-shaped deformation of the wavefront and thus the astigmatism portion of a wavefront deformation. The Zernike coefficients Z7 and Z8 stand for coma, the Zernike coefficient Z9 stands for spherical aberration, and the Zernike coefficients Z10 and Z11 stand for trefoil, etc.

The particularly critical extent of the overlay is determined as a linear combination of the odd-numbered pupil Zernike that is dependent on the illumination setting.

FIGS. 3A to 3F and 4A to 4F each show aberration diagrams that quantitatively indicate the correction state of the wavefront in the effective image field of the projection lens on the basis of the field profiles of different selected Zernike coefficients Z2, Z3 etc. Along the x-axes, in each case selected field points are given along the center of the effective image field in the x-direction (extending perpendicularly to the scanning direction). FIGS. 3A to 3F show scanner-integrated "Zernike fingerprints" (that is to say averaged in the y-direction). Scanning in the y-direction results in averaging of the image aberrations in the scanning direction. FIGS. 4A to 4F show what are known as "fading fingerprints," that is to say the variance along the y-axis. The variable "fading" can be used to describe the loss in contrast caused by the image aberrations during the scanning process.

The lines NOM with a diamond symbol represent the nominal values that result from a calculation of the wavefront on the basis of the published design specification (table relating to FIG. 6 in WO 2006/121008 A1). These represent the initial state to be optimized of the initial projection lens before the corrective freeform surfaces on the deflection mirrors are produced.

The lines CORR with the cross symbol represent the corresponding values in the state that has been corrected via freeform surfaces on the deflection mirrors.

The lines in FIGS. 5A and 5B represent the surface topography of the first deflection mirror FM1 (FIG. 5A) and of the second deflection mirror FM2 (FIG. 5B) after production of the freeform surface on the basis of iso-deformation lines in the region of the footprints, that is to say the illuminated regions. The iso-deformation lines are lines of the same deviation of the non-rotation-symmetric freeform surfaces from a planar reference surface. The numbers indicate the local deviation in nanometers.

In the case of almost all the Zernike coefficients illustrated, a reduction, attained by the correction, in the variation of the aberration level over the image field (that is to say a reduction of the PV value) is immediately noticeable. Particularly pronounced is the corrective effect inter alia in the case of the tilt of the wavefront in the x-direction (Z2) and the y-direction (Z3). Here, the peak-to-valley ratio in the nominal design (before correction) lies in the order of magnitude of approximately 1 nm, while the corresponding PV value after correction lies in an order of magnitude of less than 0.2 nm. In the case of the defocus aberration (Z4), a reduction of the PV value to approximately half the value of the uncorrected lens is achieved, in the astigmatism portion (Z5) the reduction is approximately half. Less strong, yet still pronounced, are the effects in the case of Z6 and Z7. The correction potential is generally mainly dependent on the spatial frequency of the freeform surface and the size of the subaperture on the mirrors.

In the case of the fading fingerprints, there are likewise significant reductions of the PV values due to the non-rotation-symmetric correction surfaces.

In the example shown, the freeform surfaces exhibit approximately mirror symmetry with respect to the meridional plane (y-axis). This is a special case in the theoretical optics design aberration, that is to say the aberration which would result in the case of a projection lens constructed in accordance with the design specification. In real projection lenses, the freeform aspheres or freeform surfaces are generally not symmetric. The variation of individual real projection lenses with respect to the aberration profile can be relatively great. For this reason, the individual asphere correction also varies and generally has no symmetries.

The spatial distribution of hills and valleys and the typical lateral dimensions thereof depend on many individual factors, inter alia, from the production of the individual components, from the assembly thereof, and on characteristics of the use.

The spatial frequency of the hill-and-valley structure of a freeform surface can be quantified for example by way of the number of local maxima and minima of the wavy mirror surface in a direction under consideration (for example x-direction). This number can range for example from 2 to 10, possibly also above. Lateral dimensions can be quantified for example by a valley-to-valley distance of immediately adjacent valleys in one direction (for example x-direction). This distance can range for example from 100 μm to 300 μm, in particular range from 1 mm to 100 mm, and even higher, rarely lower. Hills and valleys are frequently distributed irregularly in terms of arrangement and size over the mirror surface. The spatial distribution is specific to the individual projection lens.

Some aspects of the disclosure have been explained with reference to exemplary embodiments in which both mirror surfaces before the correction are planar surfaces and after correction still have an approximately planar shape (with form deviations to form a freeform surface). The disclosure can also be used in other types of projection lenses. The international patent application with the publication number WO 2005/069055 A2 discloses for example catadioptric in-line systems having a straight optical axis, three imaging lens parts that are connected one behind another, and two concave mirrors which are in each case arranged at an optical distance from a pupil surface and in each case in optical vicinity to a field surface. The mirror surfaces (one or both) thereof can likewise be configured as correction surfaces in the form of a freeform surface or be embodied as a correction asphere in accordance with the method proposed here. The disclosure content of this document with respect to the basic construction of projection lenses is incorporated by reference in the content of this description.

What is claimed is:

1. A catadioptric projection lens configured to image a pattern of a mask arranged in an effective object field of an object plane of the projection lens into an effective image field arranged in an image plane of the projection lens via electromagnetic radiation with an operating wavelength $\lambda < 260$ nm, the catadioptric projection lens comprising:
   a multiplicity of lens elements; and
   a multiplicity of mirrors comprising a concave mirror, a first mirror and a second mirror,
   wherein:
      the lens elements and mirrors define a projection beam path that extends from the object plane to the image plane;
      the projection path contains a pupil plane;
      the first mirror comprises a first mirror surface in the projection beam path between the object plane and the pupil plane in an optical vicinity of a first field plane that is optically conjugate to the object plane;
      the second mirror comprises a second mirror surface in the projection beam path between the pupil plane and the image plane in an optical vicinity of a second field plane that is optically conjugate to the first field plane; and
      at least one member selected from the group consisting of the first mirror and the second mirror comprises a freeform surface.

2. The catadioptric projection lens of claim 1, wherein:
   an imaging quality of the projection lens is characterizable by a higher order of the field variation of the magnitude of at least one aberration in a field direction of the image field;
   the freeform surface of a best-adapted planar or rotation-symmetric reference surface deviates at one or more positions; and
   a spatial distribution of the deviations is such that the field variation is less than a reference configuration in which the mirror surface has the shape of the best-adapted reference surface.

3. The catadioptric projection lens of claim 2, wherein the aberration comprises at least one member selected from the group consisting of a tilt of the wavefront, a first-order coma, a trefoil, and a higher-order coma.

4. The catadioptric projection lens of claim 2, wherein the first mirror surface comprises a first freeform surface, and the second mirror surface comprises a second freeform surface.

5. The catadioptric projection lens of claim 1, wherein the first mirror surface comprises a first freeform surface, and the second mirror surface comprises a second freeform surface.

6. The catadioptric projection lens of claim 5, wherein a shape of the first freeform surface differs from a shape of the second freeform surface.

7. The catadioptric projection lens of claim 5, wherein a shape of the first freeform surface is adapted to a shape of the second freeform surface such that, during use of the catadioptric project lens: i) the first freeform surface brings about a desired change of at least one target aberration and an undesired change of at least one residual aberration; and ii) the second freeform surface at least partially compensates the change of the residual aberration.

8. The catadioptric projection lens of claim 1, wherein no optical element is between the first mirror surface and the first field plane.

9. The catadioptric projection lens of claim 8, wherein no optical element is arranged between the second mirror surface and the second field plane.

10. The catadioptric projection lens of claim 1, wherein no optical element is arranged between the second mirror surface and the second field plane.

11. The catadioptric projection lens of claim 1, wherein an absolute value of a subaperture ratio SAR on the first mirror surface is less than 0.3.

12. The catadioptric projection lens of claim 11, wherein an absolute value of a subaperture ratio SAR on the second mirror surface is less than 0.3.

13. The catadioptric projection lens of claim 1, wherein an absolute value of a subaperture ratio SAR on the second mirror surface is less than 0.3.

14. The catadioptric projection lens of claim 1, wherein an absolute value of a subaperture ratio SAR on at least one surface selected from the group consisting of the first mirror surface and the second mirror surface is less than 0.2.

15. The catadioptric projection lens of claim 1, wherein:
the projection lens comprises:
- a first lens part configured to image the effective object field into a first real intermediate image;
- a second lens part configured to produce a second real intermediate image via the radiation coming from the first lens part; and
- a third lens part configured to image the second real intermediate image into the image plane;

the first real intermediate image is located in the optical vicinity of the first field plane; and
the second real intermediate image is located in the optical vicinity of the second field plane.

16. The catadioptric projection lens of claim 1, wherein:
the first mirror comprises a first plane mirror;
the second mirror comprises a second plane mirror; and
the concave mirror is in the optical vicinity of the pupil plane between the first and second field planes.

17. The catadioptric projection lens of claim 1, wherein the first mirror comprises a concave mirror, and the second mirror comprises a concave mirror.

18. The catadioptric projection lens of claim 1, wherein the first mirror surface comprises a freeform surface.

19. The catadioptric projection lens of claim 1, wherein the second mirror surface comprises a freeform surface.

20. A method for producing a catadioptric projection lens to image a pattern of a mask arranged in an effective object field of an object plane of the projection lens into an effective image field in an image plane of the projection lens by means of electromagnetic radiation with an operating wavelength $\lambda < 260$ nm, the method comprising:
- constructing an initial projection lens having a multiplicity of lens elements and a multiplicity of mirrors comprising at least one concave mirror such that the lens elements and mirrors define a projection beam path that extends from the object plane to the image plane and contains at least one pupil plane, the multiplicity of mirrors further comprising first and second mirrors, the first mirror comprising a first mirror surface in the projection beam path between the object plane and the pupil plane in an optical vicinity of a first field plane that is optically conjugate to the object plane, and the second mirror comprising a second mirror surface in the projection beam path between the pupil plane and the image plane in an optical vicinity of a second field plane that is optically conjugate to the first field plane;
- measuring an imaging quality of the projection lens to determine a spatial distribution of the extent of at least one target aberration in the effective image field;
- selecting the first mirror surface and/or the second mirror surface as the correction surface; and
- changing the first mirror surface and/or the second mirror surface such that the first mirror surface and/or the second mirror surface comprises a freeform surface such that a level of the target aberration in the effective image field is reduced compared to the level in the initial projection lens.

\* \* \* \* \*